(12) United States Patent
Nakano

(10) Patent No.: US 9,117,892 B2
(45) Date of Patent: Aug. 25, 2015

(54) SEMICONDUCTOR WAFER WITH IMPROVED CURRENT-VOLTAGE LINEARITY

(75) Inventor: Tsuyoshi Nakano, Sodegaura (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 53 days.

(21) Appl. No.: 13/253,614

(22) Filed: Oct. 5, 2011

(65) Prior Publication Data
US 2012/0025271 A1 Feb. 2, 2012

Related U.S. Application Data

(63) Continuation-in-part of application No. PCT/JP2010/002447, filed on Apr. 2, 2010.

(30) Foreign Application Priority Data

Apr. 6, 2009 (JP) ................... 2009-092422

(51) Int. Cl.
*H01L 29/778* (2006.01)
*H01L 29/66* (2006.01)
*H01L 29/812* (2006.01)

(52) U.S. Cl.
CPC ...... *H01L 29/7786* (2013.01); *H01L 29/66462* (2013.01); *H01L 29/7785* (2013.01); *H01L 29/66856* (2013.01); *H01L 29/812* (2013.01)

(58) Field of Classification Search
CPC . H01L 29/778; H01L 29/205; H01L 29/7782; H01L 2924/13064; H01L 29/812; H01L 29/7785; H01L 29/7786; H01L 29/668562; H01L 29/66462; H01L 29/66856

USPC ........................................... 257/194
See application file for complete search history.

(56) References Cited

U.S. PATENT DOCUMENTS 5,404,032 A * 4/1995 Sawada et al. ................ 257/192
5,449,928 A * 9/1995 Matsugatani et al. ........ 257/194
(Continued)

FOREIGN PATENT DOCUMENTS

JP S62-076565 A 4/1987
JP H4-129231 A 4/1992
(Continued)

OTHER PUBLICATIONS

David O. Hayward, Quantum Mechanics for Chemists, Oct. 31, 2007, Published by The Royal Society of Chemistry, Pertinent pp. 26-31—Particle in a One-dimensional Box.*
(Continued)

*Primary Examiner* — William F Kraig
*Assistant Examiner* — Pavel Ivanov
(74) *Attorney, Agent, or Firm* — Sughrue Mion, PLLC

(57) ABSTRACT

There is provided a high-performance compound semiconductor epitaxial wafer that has an improved linearity of the voltage-current characteristic, a producing method thereof, and a judging method thereof. Provided is a semiconductor wafer including a compound semiconductor that produces a two-dimensional carrier gas, a carrier supply semiconductor that supplies a carrier to the compound semiconductor, and a mobility lowering semiconductor that is disposed between the compound semiconductor and the carrier supply semiconductor and that has a mobility lowering factor that makes the mobility of the carrier in the mobility lowering semiconductor lower than the mobility of the carrier in the compound semiconductor.

8 Claims, 11 Drawing Sheets

(56) References Cited

U.S. PATENT DOCUMENTS

| | | | |
|---|---|---|---|
| 5,479,028 A * | 12/1995 | Tomioka et al. | 257/76 |
| 5,751,029 A | 5/1998 | Matsushita et al. | |
| 5,844,260 A * | 12/1998 | Ohori | 257/190 |
| 2002/0000570 A1* | 1/2002 | Nakajima et al. | 257/192 |
| 2004/0169194 A1* | 9/2004 | Noda | 257/192 |
| 2006/0076576 A1* | 4/2006 | Osada et al. | 257/192 |
| 2006/0113563 A1* | 6/2006 | Osada et al. | 257/192 |
| 2006/0192228 A1* | 8/2006 | Nakano et al. | 257/192 |
| 2007/0215905 A1* | 9/2007 | Kohiro et al. | 257/194 |
| 2008/0106851 A1* | 5/2008 | Arnold et al. | 361/525 |
| 2008/0283882 A1 | 11/2008 | Nogami | |
| 2009/0206319 A1* | 8/2009 | Pilgrim et al. | 257/6 |

FOREIGN PATENT DOCUMENTS

| | | | |
|---|---|---|---|
| JP | 05-006905 A | | 1/1993 |
| JP | 05-251477 A | | 9/1993 |
| JP | 06-333956 A | | 12/1994 |
| JP | 07-14850 A | | 1/1995 |
| JP | 07-153937 | * | 6/1995 |
| JP | 07-153937 A | | 6/1995 |
| JP | 08-316461 A | | 11/1996 |
| JP | 09-172165 A | | 6/1997 |
| JP | 09-283745 A | | 10/1997 |
| JP | 10-56168 A | | 2/1998 |
| JP | 11-354776 A | | 12/1999 |
| JP | 2000-183334 A | | 6/2000 |
| JP | 2001-267332 A | | 9/2001 |
| JP | 2004-207473 | | 7/2004 |
| JP | 2004-221363 | | 8/2004 |
| JP | 2008-288365 A | | 11/2008 |

OTHER PUBLICATIONS

Umesh K. Mishra and Jasprit Singh, Semiconductor Device Physics and Design, 2008, Springer, p. 60, ISBN 978-1-4020-6481-4 (e-book).*

S. Kiravittaya, U. Manmontri, S. Sopitpan, S. Ratanathammaphan, C. Antarasen, M. Sawadsaringkarn, S. Panyakeow, AlGaAs/GaAs/InGaAs composite MQW structures for photovoltaic applications, 2001 Elsevier Science B.V., Solar Energy Materials & Solar Cells 68 (2001) 89-95.*

Glisson, Hauser et al., Monte Carlo simulation of realspace electron transfer in GaAsAlGaAs heterostructures, Oct. 1980, AIP, Journal of Applied Physics 51, 5445 (1980); doi: 10.1063/1.327500.*

Klaus Lucas, Applied Statistical Thermodynamics, Aug. 1991, Springer-Verlag Berlin Heidelberg New York (1991), pp. 63-73.*

International Preliminary Report on Patentability for corresponding International Patent Application No. PCT/JP2010/002447 mailed Nov. 24, 2011.

First Office Action issued Jun. 3, 2013 in Chinese Patent Application No. 201080014373.4 to Sumitomo Chemical Co., Ltd., with translation.

Office Action issued Jun. 17, 2014 in counterpart Japanese Patent Application No. 2010-086842.

Office Action issued Sep. 29, 2014 in counterpart Taiwanese Application No. 099110514 to Sumitomo Chemical Co., Ltd., with translation.

Office Action issued in Mar. 11, 2015 in counterpart Taiwanese Application No. 099110514 with English translation.

Office Action issued on Mar. 10, 2015 in corresponding Japanese Patent Application 2010-086842.

* cited by examiner

SEMICONDUCTOR WAFER WITH IMPROVED CURRENT-VOLTAGE LINEARITY

The contents of the following Japanese patent application and PCT patent application are incorporated herein by reference:
 JP2009-092422 filed on Apr. 6, 2009, and
 PCT/JP2010/002447 filed on Apr. 2, 2010.

TECHNICAL FIELD

The present invention relates to a semiconductor wafer, a method of producing a semiconductor wafer, a method of judging a quality of a semiconductor wafer and an electronic device.

BACKGROUND ART

JP7-14850A discloses a heterojunction field effect transistor which includes an undoped GaAs layer and an undoped InGaAs layer as an active layer, and AlGaAs layers in which Si is partially added and which sandwich the active layer. JP10-56168A discloses a field effect transistor in which a difference in electron affinity around the interface between a lower carrier supply layer and a channel layer of the field effect transistor is larger than a difference in electron affinity around the interface between the channel layer and an upper carrier supply layer. JP11-354776A discloses an high electron mobility transistor (HEMT) using crystal stack in which a n-type AlGaAs carrier supply layer, an undoped AlGaAs spacer layer, an undoped GaAs channel layer, an undoped InGaAs channel layer, an undoped GaAs spacer layer, and an n-type GaAs channel layer are sequentially layered on a semi-insulating GaAs wafer.

JP2000-183334A discloses a heterojunction field effect transistor which includes buffer layers made of GaAs and AlGaAs, a lower electron supply layer made of n-type AlGaAs, a channel layer made of i-type InGaAs, an upper electron supply layer made of n-type AlGaAs, a schottky layer made of i-type AlGaAs, an ohmic contact layer made of n-type GaAs or the like, a gate electrode made of WSi, and a source electrode and drain electrode made of Au, Ge or Ni. In this transistor, the product Nt for the upper electron supply layer is about 1.4 times of the maximum sheet carrier concentration at the heterojunction interface, and the product Nt, wherein N is the doping concentration and t is the thickness of the layer, for the lower electron supply layer falls within a range of 1.0 to 2.0 times of the maximum sheet carrier concentration.

Patent Document 1: JP7-14850A
Patent Document 2: JP10-56168A
Patent Document 3: JP11-354776A
Patent Document 4: JP2000-183334A

SUMMARY OF THE INVENTION

Problem to be Solved by the Invention

The inventions disclosed by Patent Documents 1 to 4 can improve a distortion characteristic of a heterojunction field effect transistor. However, these inventions do not consider a fact that electrons in an excited state can be a factor which adversely affects linearity of the voltage-current characteristic. Consequently, the linearity of the voltage-current characteristics in the heterojunction field effect transistors fabricated by implementing the above inventions is low, and current waveforms output by such heterojunction field effect transistors are deformed. In view of the above problems in the conventional art, the present invention has as an object to provide a semiconductor wafer that has a fine linearity of the voltage-current characteristic which is appropriate for production of a transistor having better distortion characteristics.

Means for Solving Problem

According to the first aspect related to the present invention, provided is one exemplary semiconductor wafer that includes a compound semiconductor that produces a two-dimensional carrier gas, a carrier supply semiconductor that supplies carriers to the compound semiconductor, and a mobility lowering semiconductor disposed between the compound semiconductor and the carrier supply semiconductor, and the mobility lowering semiconductor has a mobility lowering factor that makes the mobility of the carrier in the mobility lowering semiconductor lower than the mobility of the carrier in the compound semiconductor. In the mobility lowering semiconductor, the existence probability of carriers in an excited state is higher than the existence probability of carriers in the ground state. The excited state is, for example, a state where the carrier is in the first excited level.

When a current y that flows in the compound semiconductor under the application of a voltage to between two different points on the compound semiconductor is approximated by an approximating polynomial $y=ax^3+bx^2+cx$, where x, which is a variable, represents an electric field intensity that corresponds to the voltage and varies within a range of from −1.5 [kV/cm] to +1.5 [kV/cm], the absolute value of the ratio of the third-order coefficient 'a' of the approximating polynomial to the first-order coefficient 'c' of the approximating polynomial, or $|a/c|$, is less than 0.037 $[(kV/cm)^{-2}]$. The mobility lowering factor is, for example, an impurity, a crystal defect, a low-mobility material, or a band-barrier material.

For instance, the carrier is an electron, and the impurity is a donor impurity. The carrier can be a hole, and the impurity can be an acceptor impurity. For example, the carrier supply semiconductor is N-type AlGaAs, the mobility lowering semiconductor is non-P-type GaAs, and the compound semiconductor is InGaAs.

The mobility lowering semiconductor is, for example, N-type GaAs that contains $3.6 \times 10^{18}$ $[cm^{-3}]$ or less of a donor impurity. The donor impurity is, for example, at least one atom chemical element selected from the group consisting of Si, Se, Ge, Sn, Te and S.

According to the second aspect related to the present invention, provided is a method of producing a semiconductor wafer that includes forming a compound semiconductor that produces a two-dimensional carrier gas, forming a mobility lowering semiconductor on the compound semiconductor, and forming, on the mobility lowering semiconductor, a carrier supply semiconductor that supplies carriers to the compound semiconductor. The mobility lowering semiconductor has a mobility lowering factor that makes the mobility of the carrier in the mobility lowering semiconductor lower than the mobility of the carrier in the compound semiconductor.

According to the third aspect related to the present invention, provided is a method of judging the quality of a semiconductor wafer, the method comprising: providing the semiconductor wafer that includes a compound semiconductor having a composition that produces a two-dimensional carrier gas, a carrier supply semiconductor that supplies a carrier carriers to the compound semiconductor, and a mobility lowering semiconductor that is disposed between the compound semiconductor and the carrier supply semiconductor and that has a mobility lowering factor that makes the mobility of carriers in the mobility lowering semiconductor lower than the mobility of carriers in the compound semiconductor; disposing a pair of ohmic electrodes on the compound semiconductor; applying voltages to the pair of ohmic electrodes and measuring current values that correspond to the respective voltages applied and that flows through the compound semiconductor; approximating values of the current corresponding to the voltage to an approximating polynomial of an electric field intensity corresponding to the voltage; and judging whether the absolute value of the ratio of the third-order coefficient of the approximating polynomial to the first-order coefficient of the approximating polynomial is less than a prescribed value or not. In this judging method, the semiconductor wafer can be judged as conforming if the absolute value of the ratio of the third-order coefficient to the first-order coefficient is less than 0.037 $[(kV/cm)^{-2}]$ when the electric field intensity varies within a range of from $-1.5$ [kV/cm] to $+1.5$ [kV/cm].

According to the fourth aspect related to the present invention, provided is an electronic device that a compound semiconductor that produces a two dimensional carrier gas and has a channel through which the two-dimensional carrier gas flows, a carrier supply semiconductor that supplies carriers to the compound semiconductor, and a mobility lowering semiconductor that is disposed between the compound semiconductor and the carrier supply semiconductor and that has a mobility lowering factor that makes the mobility of carriers in the mobility lowering semiconductor lower than the mobility of carriers in the compound semiconductor, a pair of ohmic electrodes that connect to each other by the channel, and a control electrode that controls impedance between the pair of the ohmic electrodes.

In this specification, the phrase "B on A" encompasses both the cases where "B is in contact with A" and "other component intervenes between B and A."

MODE FOR CARRYING OUT THE INVENTION

Figure 1:
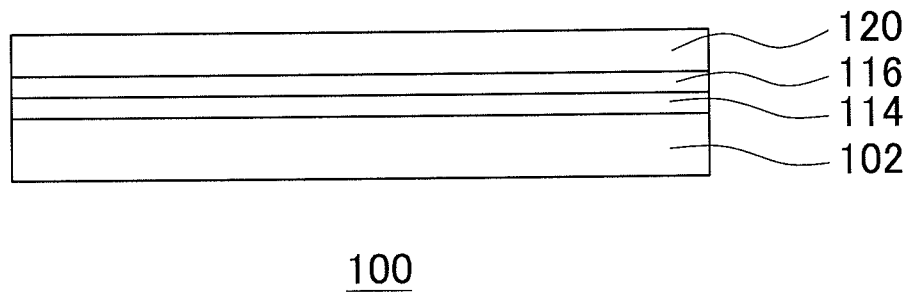
FIG. 1 schematically illustrates an example of a sectional view of a semiconductor wafer 100.

FIG. 1 schematically illustrates an example of a sectional view of a semiconductor wafer 100. The semiconductor wafer 100 includes a base wafer 102, a compound semiconductor 114, a mobility lowering semiconductor 116 and a carrier supply semiconductor 120.

The base wafer 102 is the wafer that supports other components in the semiconductor wafer 100. The base wafer 102 is, for example, a Ge wafer, a germanium-on-insulator (GOI) wafer, or a Group 3-5 semiconductor wafer made of GaAs, InGaAs, AlGaAs, GaN, AlGaN and so forth. Alternatively, the base wafer 102 can be a Si wafer, a silicon-on-insulator (SOI) wafer, a sapphire wafer, a glass wafer or a resin wafer such as a PET film. The base wafer 102 can include a buffer layer. The base wafer 102 has a shape of, for example, a wafer.

The compound semiconductor 114 produces a two-dimensional carrier gas. The two-dimensional carrier gas is the aggregation of conduction electrons or holes in which the carries can freely migrate in two-dimensional directions but they are bounded in a direction perpendicular to the two dimensional directions to the extent that a quantum effect is exhibited. The quantum effect is a phenomenon in which energy levels of carriers become discrete. The compound semiconductor 114 is, for example, a Group 3-5 compound semiconductor such as InGaAs, GaAs, InGaP or the like. The compound semiconductor 114 can be a compound semiconductor that has a piezo effect such as GaN.

The mobility lowering semiconductor 116 is disposed between the compound semiconductor 114 and the carrier supply semiconductor 120. The mobility lowering semiconductor 116 has a mobility lowering factor that constrains the carrier migration. Since the mobility lowering semiconductor 116 has the mobility lowering factor, the mobility of a carrier in the mobility lowering semiconductor 116 is lower than the mobility of a carrier in the compound semiconductor 114.

Here, from the experiments performed by the inventors of the present invention, it is demonstrated that, in the compound semiconductor 114, the existence probability of the carrier in the ground state is higher than the existence probability of the carrier in the excited state. To put this another way, it is demonstrated that for the carriers in the compound semiconductor 114, the probability distribution of the carriers amongst different states is such that the probability of a given carrier existing in the ground state is higher than the probability of a given carrier existing in the excited state. It is also demonstrated that, while in a semiconductor that is in contact with the compound semiconductor 114, the existence probability of the carrier in the excited state is higher than the existence probability of the carrier in the ground state. Here, the excited state refers to a state where a carrier is at an energy level higher than the ground level.

A carrier in the excited state can be one of the factors causing distortion in the voltage-current characteristic of the transistor. For example, when the semiconductor wafer 100 is used for a transistor in which a current running through the source and the drain is controlled by a gate voltage, the linearity of the source-drain current corresponding to the gate voltage is degraded if carriers in the excited state are included in the channel.

Considering this fact, the mobility of a carrier in the excited state, which can be a factor deteriorating the linearity of the voltage-current characteristic, can be lowered by providing the mobility lowering semiconductor 116 in the semiconductor adjacent to the compound semiconductor 114 in which the existence probability of electrons in the excited state is high. Consequently, when the semiconductor wafer 100 is used for an electronic element such as a transistor, the linearity of the voltage-current characteristic of the electronic element can be improved.

The mobility lowering factors which the mobility lowering semiconductor 116 has are, for example, an impurity, a crystal defect, a low-mobility material, or a band-barrier material. When a carrier is an electron, a donor can serve as the mobility lowering factor. When a carrier is a hole, an acceptor impurity can serve as the mobility lowering factor. The band-barrier material is, for example, a semiconductor that has a band gap larger than that of the compound semiconductor 114.

When the compound semiconductor 114 is InGaAs that produces an N-type two-dimensional carrier gas, the mobility lowering semiconductor 116 is, for example, non-P type GaAs. The mobility lowering semiconductor 116 can be N-type GaAs that contains a donor impurity of $3.6 \times 10^{18}$ [cm$^{-3}$] or less, preferably $3.0 \times 10^{18}$ [cm$^{-3}$] or less, more preferably $1.0 \times 10^{18}$ [cm$^{-3}$] or less, and most preferably $0.5 \times 10^{18}$ [cm$^{-3}$] or less. The donor impurity is, for example, at least one chemical element selected from the group consisting of Si, Se, Ge, Sn, Te and S.

The carrier supply semiconductor 120 supplies carriers to the compound semiconductor 114. The carrier supply semiconductor 120 is made of, for example, GaAs, AlGaAs and InGaP. When the compound semiconductor 114 is a compound semiconductor that produces an N-type two-dimensional carrier gas, the carrier supply semiconductor 120 is, for example, N-type AlGaAs. The carrier supply semiconductor 120 can have an electrode. The semiconductor wafer 100 can have a barrier layer that forms a barrier against the two-dimensional carrier gas and that is disposed between the electrode and the compound semiconductor 114.

The voltage-current characteristic of the semiconductor wafer 100 can be obtained by measuring a current that flows between two different points in the compound semiconductor 114 when a voltage is applied between the two points. When a current that flows through the semiconductor wafer 100 is represented by y, the current y is expressed by an approximating polynomial $y=ax^3+bx^2+cx$, where x is variable and represents an electric field intensity corresponding to the voltage applied thereto.

The fineness of the linearity of the voltage-current characteristic for the semiconductor wafer 100 can be judged by the absolute value of the ratio of the third-order coefficient 'a' of the approximating polynomial to the first-order coefficient 'c' of the approximating polynomial, or |a/c|. For example, the voltage-current characteristic can be judged as fine if the absolute value of the ratio of the third-order coefficient 'a' to the first-order coefficient 'c', or |a/c|, is less than 0.037 [(kV/cm)$^{-2}$] when the electric field intensity x varies within a range of from −1.5 [kV/cm] to +1.5 [kV/cm].

Figure 2:
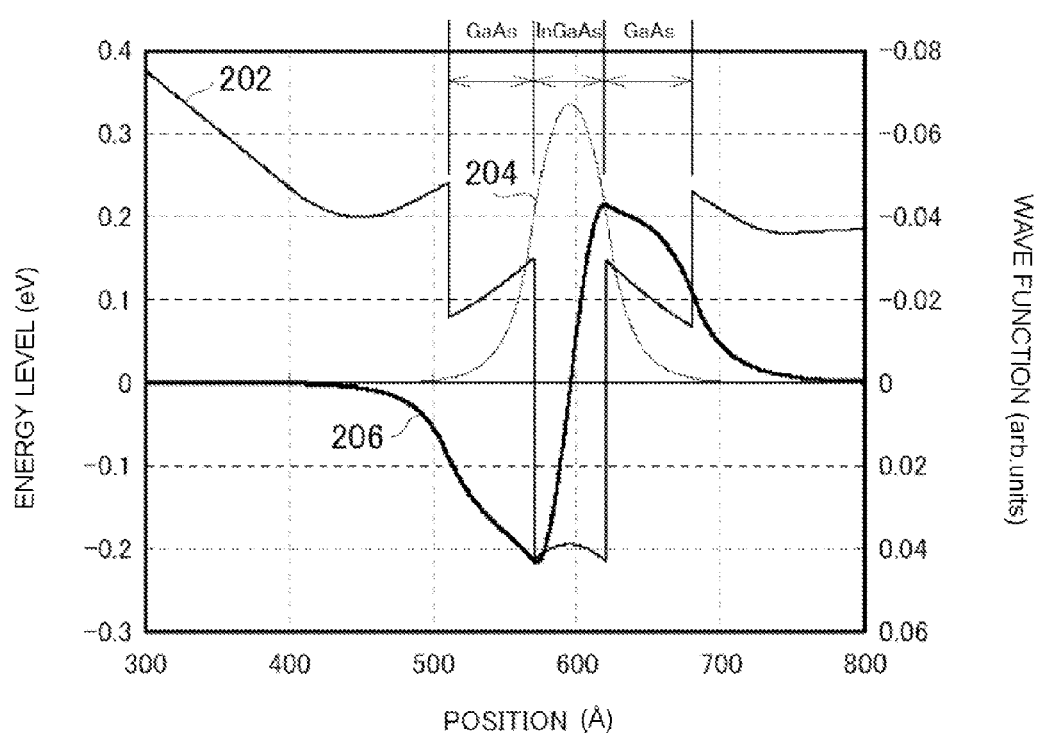
FIG. 2 illustrates an example of an energy-band diagram for the semiconductor wafer.

FIG. 2 illustrates an example of an energy-band diagram for the semiconductor wafer 100. The horizontal axis represents a position in a stack direction at a cross-section of the semiconductor wafer 100. The energy-band diagram was obtained by simulation. In the example shown in FIG. 2, a GaAs layer that has a film thickness of 6 nm and serves as the mobility lowering semiconductor 116 is provided on the both sides of an InGaAs layer that has a film thickness of 5 nm and that serves as the compound semiconductor 114 producing the two-dimensional carrier gas. It is preferable that the film thickness of the InGaAs layer and the GaAs layer be no less than 0.5 nm and no more than 100 nm, more preferably no less than 1 nm and no more than 50 nm.

The curve 202 represents the bottom energy level in the conduction band, and the left vertical axis represents a scale for the energy level. According to the curve 202, the bottom energy level in the conduction band of the InGaAs layer is lower than that of the GaAs layer, and becomes lowest around the interface with the GaAs layer. The InGaAs layer produces a two-dimensional carrier gas around the interface of the lowest energy level.

The curve 204 represents a wave function of an electron in the ground state, and the right vertical axis represents a scale for the wave function. A probability density of an electron is expressed by the square of the wave function. According to the curve 204, it is apparent that the probability density of an electron in the ground state in the InGaAs layer that produces the two-dimensional carrier gas is higher than the probability density of an electron in the ground state in the GaAs layer.

The curve 206 represents a wave function of an electron in the excited state, and the right vertical axis represents a scale for the wave function. According to the curve 206, in the GaAs layer disposed on the both sides of the InGaAs layer, the existence probability of an electron in the excited state is larger than the existence probability of an electron in the ground state. Moreover, in the InGaAs layer, the existence probability of an electron in the ground state is higher than the existence probability of an electron in the excited state. From the above stated facts, it can be understood that mainly electrons in the ground state exist in the InGaAs layer that produces the two dimensional carrier gas, and mainly electrons in the excited state exist in the GaAs layer that is disposed on the both sides of the InGaAs layer.

A planar electronic element such as a field effect transistor (also referred to as an FET) or a high electron mobility transistor (also referred to as an HEMT) exerts transistor characteristics when current flowing through a channel layer made of an InGaAs layer or the like is controlled by an electric field applied to the gate electrode. It is preferable that a transistor have a high linearity of the voltage-current characteristic.

When current flows due to the migration of electrons in the ground state among the electrons which contribute to the voltage-current characteristics, a high linearity of the voltage-current characteristic can be obtained. While current flows due to the migration of electrons in the excited state, a variation in the electron migration amount corresponding to a variation in the electric field intensity becomes non-linear due to electron interband transitions. Therefore, when the existence probability of an electron in the excited state is high, the linearity of the voltage-current characteristic becomes low.

In order to address this, a ratio of the electrons in the ground state that contribute to the voltage-current characteristic can be raised by inhibiting the flow of the electrons in the excited state and reducing the mobility, and consequently causing mainly the electrons in the ground state to generate a channel current of the transistor. As a result, the linearity of the voltage-current characteristic for the transistor can be improved.

In the example illustrated in FIG. 2, the GaAs layer disposed on the both sides of the InGaAs layer have many electrons in the excited state. Therefore, by adding a mobility lowering factor in the GaAs layer, it is possible to inhibit the flow of electrons in the excited state so that the ratio of the electrons in the ground state that contribute to the voltage-current characteristic can be raised.

When the compound semiconductor 114 is the InGaAs that produces an N-type two-dimensional carrier gas, it is preferable that the mobility lowering factor be an N-type impurity. For example, when the mobility lowering semiconductor 116 is a GaAs layer, an N-type impurity can be doped in to the GaAs layer to maintain the electron concentration accumulated in the channel and to prevent an increase in the electronic resistivity in the vertical direction between the channel and an electrode provided on the device surface.

In order to lower the mobility of an electron in the excited state in the GaAs layer that functions as the mobility lowering semiconductor 116, it is necessary to increase the carrier concentration. However, when the carrier concentration is too high, the mobility of an electron in the ground state is lowered so that an average mobility of an electron in the ground state that runs through the channel layer is also reduced.

According to the results of the experiment performed by the inventors of the present invention and so forth, when the mobility lowering semiconductor 116 is the GaAs layer, it is preferable that the carrier concentration in the mobility lowering semiconductor 116 in which an N-type impurity is doped be $3.6 \times 10^{18}$ [cm$^3$] or less. The carrier concentration can be $3.0 \times 10^{18}$ [cm$^{-3}$] or less, more preferably $1.0 \times 10^{18}$ [cm$^{-3}$] or less, and most preferably $0.5 \times 10^{18}$ [cm$^{-3}$] or less. When such conditions are met, it is possible to obtain a compound semiconductor epitaxial wafer that has the voltage-current characteristic with a fine linearity. In terms of measurement accuracy, it is preferable that the voltage-current characteristic be measured by a Hall measuring method when the carrier concentration is $3 \times 10^{18}$ [cm$^{-3}$] or more, and it is preferable that the voltage-current characteristic be measured by a capacitance-voltage (CV) method when the carrier concentration is less than $3 \times 10^{18}$ [cm$^{-3}$].

Figure 3:
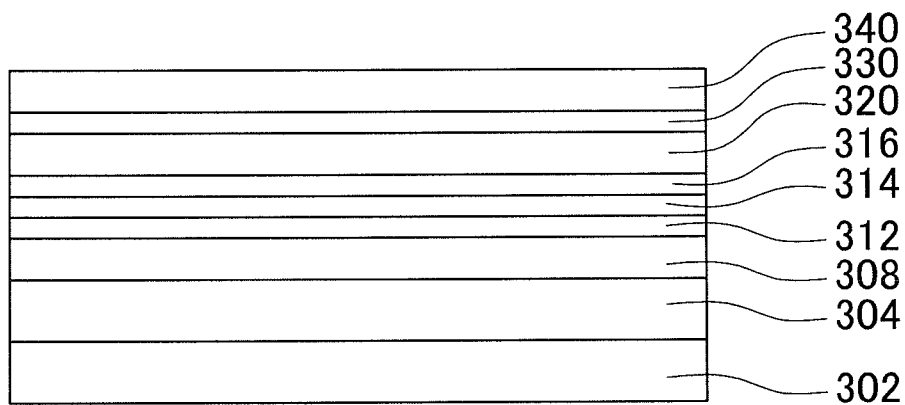
FIG. 3 is an example of a sectional view of a semiconductor wafer 300.

FIG. 3 is an example of a sectional view of a semiconductor wafer 300. The semiconductor wafer 300 includes a base wafer 302, a buffer layer 304, a carrier supply semiconductor 308, a mobility lowering semiconductor 312, a compound semiconductor 314, a mobility lowering semiconductor 316, a carrier supply semiconductor 320, a barrier formation semiconductor 330 and a contact layer 340.

The base wafer 302 and the buffer layer 304 correspond to the base wafer 102 in the semiconductor wafer 100. The carrier supply semiconductor 308 and the carrier supply semiconductor 320 correspond to the carrier supply semiconductor 120. The mobility lowering semiconductor 312 and the mobility lowering semiconductor 316 correspond to the mobility lowering semiconductor 116. The compound semiconductor 314 corresponds to the compound semiconductor 114. The semiconductor wafer 300 is different from the semiconductor wafer 100 in that it has the contact layer 340.

The semiconductor wafer 300 includes the carrier supply semiconductor 308 and the carrier supply semiconductor 320 on the sides R of the compound semiconductor 314. With such structure, the number of carriers in the two-dimensional carrier gas produced by the compound semiconductor 314 is increased and therefore the performance of the electronic element can be enhanced. The semiconductor wafer 300 further includes the mobility lowering semiconductor 312 and the mobility lowering semiconductor 316 on the sides of the compound semiconductor 314. As illustrated in FIG. 2, many electrons in the excited state exist in the GaAs disposed on the both sides of the InGaAs which is the mobility lowering semiconductor 314. Since the semiconductor wafer 300 has the mobility lowering semiconductor 312 and the mobility lowering semiconductor 316 that have a mobility lowering factor and that are disposed on the sides of the compound semiconductor 314, it is possible to improve the linearity of the voltage-current characteristic of the semiconductor wafer 300.

The buffer layer 304 secures a crystalline quality of semiconductors formed on and above the buffer layer such as the compound semiconductor 314, and at the same time prevents the characteristics of the semiconductor wafer 300 from being deteriorated due to impurities left on the surface of the base wafer 302. The buffer layer 304 inhibits a leakage current generated from the semiconductor formed on and above the buffer layer. The buffer layer 304 also serves as a buffer layer that matches the lattice spacing between the compound semiconductor 314 formed on or above the buffer layer 304 and the base wafer 302. The buffer layer 304 is made of, for example, GaAs or AlGaAs.

The barrier formation semiconductor 330 forms an energy barrier between the two dimensional carrier gas and a control electrode that applies a voltage to control the current flowing through the channel of an electronic element such as FET. For example, when the control electrode is made of metal, the energy barrier is formed by the schottky junction between the barrier formation semiconductor 330 and the metal. The barrier formation semiconductor 330 is made of, for example, AlGaAs.

The contact layer 340 secures an electric conductivity between each of the pair of ohmic electrodes formed on the semiconductor wafer 300 and the barrier formation semiconductor 330 and the semiconductors situated below the barrier formation semiconductor 330. The contact layer 340 is made of, for example, GaAs or InGaAs.

Since the mobility lowering semiconductor 312 and the mobility lowering semiconductor 316 have a mobility lowering factor, the mobility of electrons in the excited state existing in the mobility lowering semiconductor 312 and the mobility lowering semiconductor 316 is reduced lower than the mobility in the compound semiconductor 314. The flow of the electrons existing in the compound semiconductor 314 becomes the main stream of the channel current in the transistor formed in the semiconductor wafer 300, and therefore it is possible to raise the ratio of electrons in the ground state which contribute to the voltage-current characteristic. Consequently, the linearity of the voltage-current characteristic in the semiconductor wafer 300 is improved. As described above, by adopting the semiconductor wafer 300 according to the embodiment, it is possible to produce an electronic element that has a fine distortion characteristic of a high-frequency signal.

Figure 4:
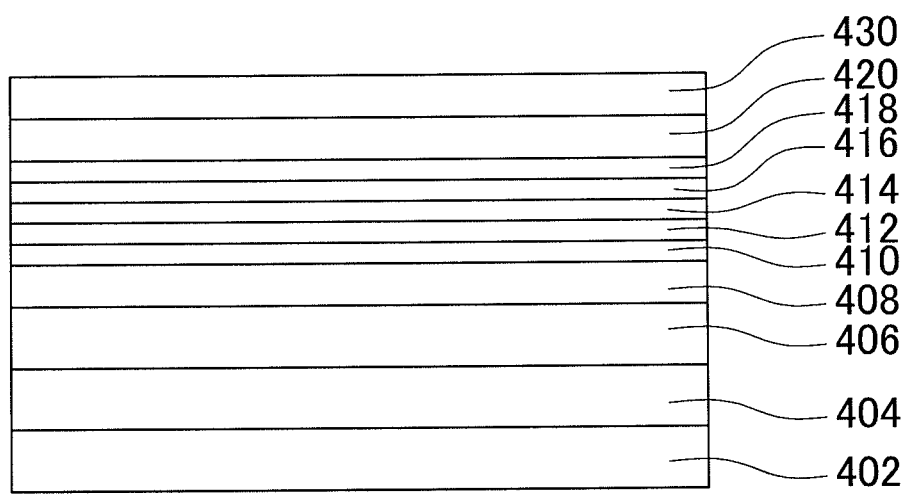
FIG. 4 is an example of a sectional view of a semiconductor wafer 400.

FIG. 4 is an example of a sectional view of a semiconductor wafer 400. The semiconductor wafer 400 includes a base wafer 402, a buffer layer 404, a buffer layer 406, a carrier supply semiconductor 408, a spacer layer 410, a mobility lowering semiconductor 412, a compound semiconductor 414, a mobility lowering semiconductor 416, a spacer layer 418, a carrier supply semiconductor 420, and a barrier formation semiconductor 430. The semiconductor wafer 400 can further include a contact layer 340 on the barrier formation semiconductor 430.

The base wafer 402 corresponds to the base wafer 302 in the semiconductor wafer 300. The carrier supply semiconductor 408 and the carrier supply semiconductor 420 correspond to the carrier supply semiconductor 308 and the carrier supply semiconductor 320. The mobility lowering semiconductor 412 and the mobility lowering semiconductor 416 correspond to the mobility lowering semiconductor 312 and the mobility lowering semiconductor 316 respectively. The compound semiconductor 414 corresponds to the compound semiconductor 314.

The semiconductor wafer 400 has a double buffer structure that includes the buffer layer 404 and the buffer layer 406. The semiconductor wafer 400 is different from the semiconductor wafer 300 in that it has the spacer layer 410 and the spacer layer 418.

The double buffer structure that includes the buffer layer 404 and the buffer layer 406 enhances the effect of the buffer layer with which the difference in the lattice spacing between the compound semiconductor 414 and the base wafer 402 is minimized. The double buffer structure further inhibits the effect of the impurities in the base wafer 402 affecting the compound semiconductor 414. The double buffer structure further reduces the leakage current. The buffer layer 404 and the buffer layer 406 are made of a material such as GaAs or AlGaAs.

The spacer layer 410 and the spacer layer 418 are formed between the carrier supply semiconductor 408 and the compound semiconductor 414, and between the carrier supply semiconductor 420 and the compound semiconductor 414 respectively. The spacer layer 410 and the spacer layer 418 limit the diffusion of an impurity in the carrier supply semiconductor 408 and the carrier supply semiconductor 420 into the compound semiconductor 414. The spacer layer 410 and the spacer layer 418 prevent the mobility of a carrier in the compound semiconductor 414 from decreasing due to impurity ion scattering. The spacer layer 410 and the spacer layer 418 are made of a material such as AlGaAs.

The barrier formation semiconductor 430 forms an energy barrier with which the electrode formed on the barrier formation semiconductor 430 can serve as a control electrode. A material for the barrier formation semiconductor 430 is, for example, AlGaAs.

As described above, the semiconductor wafer 400 has the double buffer that includes the buffer layer 404 and the buffer layer 406, and therefore the crystallinity of the compound semiconductor 414 can be improved. Consequently, the leak current can be reduced. The semiconductor wafer 400 has the spacer layer 410 and the spacer 418 so that it is possible to prevent the impurity ion scattering of an electron in the compound semiconductor 414. Therefore; when a transistor is fabricated using the semiconductor wafer 400, the transistor has an improved linearity of the voltage-current characteristic.

A method of producing the semiconductor wafer 100 illustrated in FIG. 1 will be now described. A method of producing a semiconductor wafer according to this embodiment includes a step of forming the compound semiconductor 114 that produces a two-dimensional carrier gas on the base wafer 102, a step of forming the mobility lowering semiconductor 116 that is in contact with the compound semiconductor 114 and that has a mobility lowering factor that inhibits carrier migration, and a step of forming the carrier supply semiconductor 120 that is in contact with the mobility lowering semiconductor 116 and that supplies carriers to the compound semiconductor 114.

In the step of forming the compound semiconductor 114, the base wafer 102 is placed in a reactor, and the compound semiconductor 114 is formed on the base wafer 102 by an epitaxial growth method. The base wafer 102 is a high-resistance semi-insulating GaAs single-crystal wafer. The GaAs single-crystal wafer is, for example, a GaAs wafer that is produced by a liquid encapsulated czochralski (LEC) method, a vertical bridgman (VB) method, a vertical gradient Freezing (VGF) method or the like. The GaAs single-crystal wafer can be a wafer that has a tilting angle of about 0.05 to 10 degrees with respect to one crystallographically-defined plain orientation. An example of the epitaxial growth method includes a metal organic chemical vapor deposition method (hereunder referred to as a MOCVD method) and a molecular beam epitaxy method (hereunder referred to as a MBE method).

A method of forming the compound semiconductor 114 by epitaxial growth using an MOCVD method is hereunder described. A surface of the GaAs single-crystal base wafer 102 is degreased, etched, water-washed and dried, and then the base wafer 102 is placed on a heating table of a reduced-pressure barrel-type MOCVD reactor. After the atmosphere inside the reactor is sufficiently replaced by a high-purity hydrogen, heating of the base wafer 102 is started. A wafer temperature at the time of crystal growth is, for example, any temperature from 500° C. to 800° C. When the temperature of the base wafer 102 is settled to an adequate temperature, an arsenic source is introduced into the reactor, and then a gallium source or an indium source is subsequently introduced to form an InGaAs layer by the epitaxial growth method.

As a Group 3 element source, it is possible to use a trialkylated material in which each metal atom has an alkyl group whose carbon number is 1 to 3 coupled thereto or has a hydrogen coupled thereto, such as trimethyl gallium (TMG) and trimethyl indium (TMI), or trihydride. As a Group 5 element source gas, it is possible to use arsine ($AsH_3$) or alkylarsine in which one hydrogen atom is replaced by an alkyl grope of which carbon number is 1 to 4.

Conditions for the epitaxial growth are, for example, a pressure inside the reactor of 0.1 atm, a growth temperature of 650° C. and a growth rate of 1 to 3 μm/hr. A carrier gas used as the source is, for example, high-purity hydrogen. The hereunder-described mobility lowering semiconductor 116 and the carrier supply semiconductor 120 can also be formed by the epitaxial growth using the same MOCVD method in which parameters such as a source gas, a pressure inside the reactor, a growth temperature, and a growth time are adjusted.

In the step of forming the mobility lowering semiconductor 116, the mobility lowering semiconductor 116 is formed by the epitaxial growth and such that the mobility lowering semiconductor 116 is in contact with the compound semiconductor 114. The mobility lowering semiconductor 116 is, for example, N-type GaAs. In this case, for example, a donor impurity becomes the mobility lowering factor. As the epitaxial growth method, an MOCVD method and an MBE method can be named. For example, trimethyl gallium (TMG) and arsine ($AsH_3$) are used as Group 3 element source and the Group 5 element source gas respectively to epitaxially grow the N-type GaAs mobility lowering semiconductor 116 by the MOCVD method.

The donor impurity is at least one chemical element selected from the group consisting of Si, Se, Ge, Sn, Te and S. As an N-type dopant, an alkylated material that has a hydride of the above mentioned element or an alkyl group of which carbon number is 1 to 3. For example, Si can be selected as the donor impurity and disilane ($Si_2H_6$) can be used as the N-type dopant.

The formed mobility lowering semiconductor 116 contains a donor impurity of $3.6 \times 10^{18}$ [$cm^{-3}$] or less, preferably $3.0 \times 10^{18}$ [$cm^{-3}$] or less, more preferably $1.0 \times 10^{18}$ [$cm^{-3}$] or less, and most preferably $0.5 \times 10^{18}$ [$cm^{-3}$] or less. When Si is selected as the donor impurity, an impurity concentration can be adjusted by changing the flow rate of disilane at the time of the epitaxial growth. Here, the impurity concentration is the concentration of the donor impurity contained in the mobility lowering semiconductor 116.

In the step of forming the carrier supply semiconductor 120, the carrier supply semiconductor 120 is formed on the mobility lowering semiconductor 116 by epitaxial growth. The carrier supply semiconductor 120 is, for example, N-type AlGaAs. In this case, the carrier supply semiconductor 120 supplies an electron as a carrier to the compound semiconductor 114. As the epitaxial growth method, an MOCVD method and an MBE method can be named.

For example, trimethyl gallium (TMG) and trimethyl aluminum (TMA) are used as the Group 3 element source and arsine ($AsH_3$) is used as the Group 5 element source gas respectively to epitaxially grow the N-type AlGaAs carrier supply semiconductor 120 by the MOCVD method.

The donor impurity is, for example, at least one chemical element selected from the group consisting of Si, Se, Ge, Sn, Te and S. As the N-type dopant, an alkylated material that has a hydride of the above mentioned element or an alkyl group of which carbon number is 1 to 3. For example, Si can be selected as the donor impurity and disilane ($Si_2H_6$) can be used as the N-type dopant. Through the manufacturing process including the above-described steps, the semiconductor wafer 100 can be produced.

Figure 5:
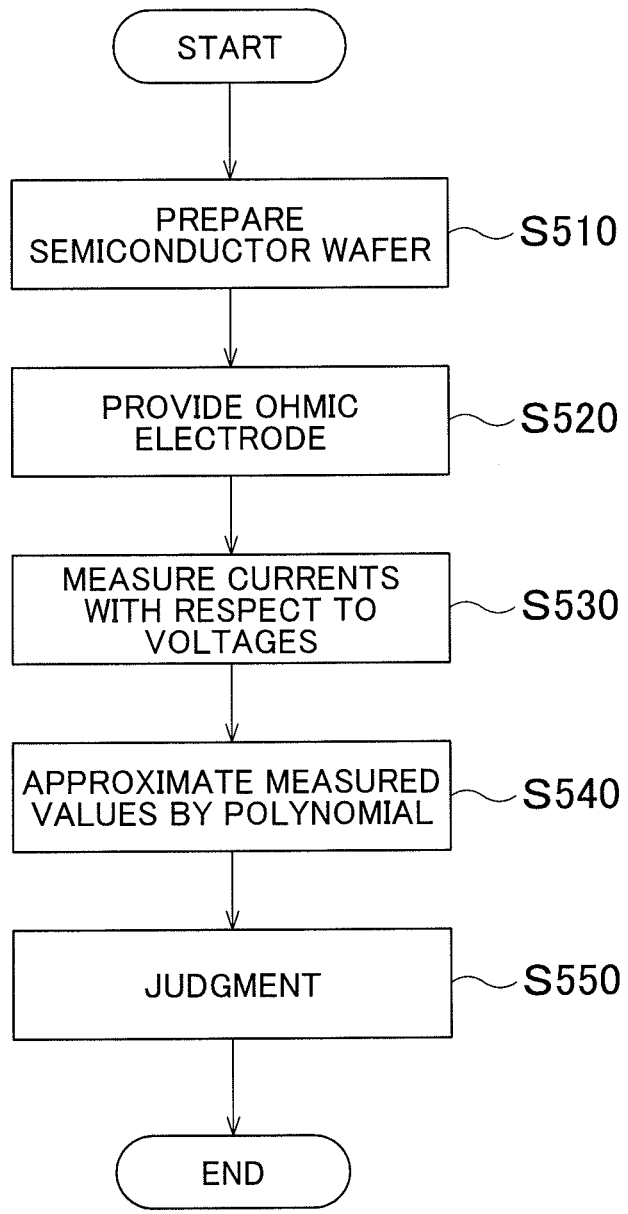
FIG. 5 is a flow chart showing an example of a judging method for the semiconductor wafer.

FIG. 5 is a flow chart showing an example of a judging method for the semiconductor wafer. As shown in FIG. 5, a method of judging the quality of a semiconductor wafer includes a step S510 of preparing a semiconductor wafer, a step S520 of providing an ohmic electrode, a step S530 of measuring current values corresponding to voltages, a step S540 of approximating measured values by an approximating polynomial, and a judgment step S550. The semiconductor wafer is, for example, the semiconductor wafer 100, the semiconductor wafer 300 and the semiconductor wafer 400. In this example, a method of producing the semiconductor wafer 100.

In the step S510 of preparing a semiconductor wafer, the semiconductor wafer 100 is prepared. In the step S520 of providing an ohmic electrode, a pair of ohmic electrodes is provided on the surface of the stack including the compound semiconductor 114, the carrier supply semiconductor 120 and the mobility lowering semiconductor 116.

In the step S530 of measuring current values corresponding to voltages, voltages are applied to the pair of ohmic electrodes and a current value is measured when each of the voltages is applied. In the step S540 of approximating measured values by an approximating polynomial, the current values measured for the voltages are approximated by an approximating polynomial which represents an electric field intensity corresponding to the voltage.

In the judgment step S550, it is judged whether the absolute value of the ratio of the third-order coefficient to the first-order coefficient of the approximating polynomial is smaller than a prescribed value or not. Depending on the judgment result, whether the quality of the semiconductor wafer is conforming or not is determined. More specifically, when the absolute value of the ratio of the third-order coefficient to the first-order coefficient is less than the prescribed value, the linearity of the voltage-current characteristic is considered to be improved by the effect of the mobility lowering semiconductor in the semiconductor wafer, and the semiconductor wafer can be judged as acceptable or conforming.

Figure 6:
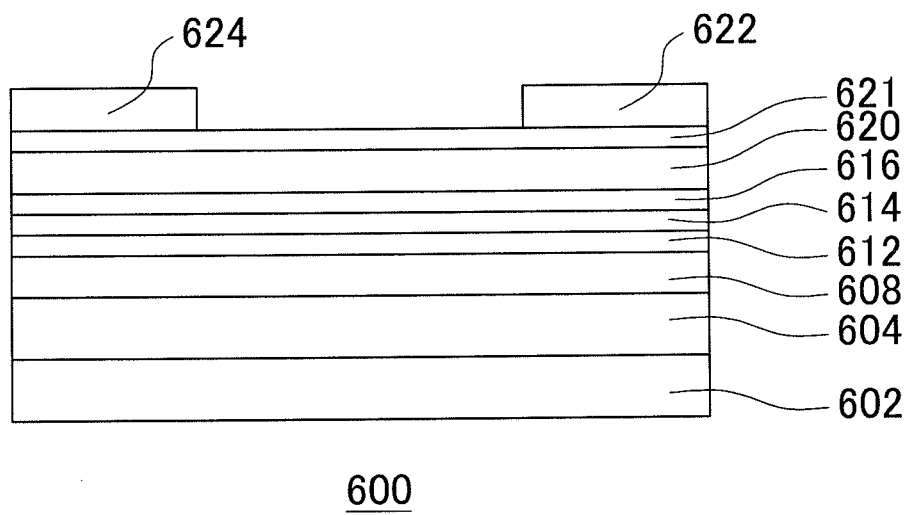
FIG. 6 illustrates an example of a semiconductor wafer for evaluation.

A semiconductor wafer 600 shown in FIG. 6 is an example of a semiconductor wafer for evaluation used in the judging method described with reference to FIG. 5. The semiconductor wafer 600 includes a base wafer 602, a buffer layer 604, a carrier supply semiconductor 608, a mobility lowering semiconductor 612, a compound semiconductor 614, a mobility lowering semiconductor 616, a carrier supply semiconductor 620, a barrier formation semiconductor 621, an ohmic electrode 622 and an ohmic electrode 624.

The base wafer 602 corresponds to the base wafer 302 in the semiconductor wafer 300. The buffer layer 604 corresponds to the buffer layer 304. The carrier supply semiconductor 608 and the carrier supply semiconductor 620 correspond to the carrier supply semiconductor 308 and the carrier supply semiconductor 320. The mobility lowering semiconductor 612 and the mobility lowering semiconductor 616 correspond to the mobility lowering semiconductor 312 and the mobility lowering semiconductor 316 respectively. The compound semiconductor 614 corresponds to the compound semiconductor 314. The barrier formation semiconductor 621 corresponds to the barrier formation semiconductor 330. The semiconductor wafer 600 is, for example, a semiconductor wafer in which an ohmic electrode 622 and an ohmic electrode 624 are provided instead of the contact layer 340 of the semiconductor wafer 300.

In the step S510 of preparing a semiconductor wafer shown in FIG. 5, a semiconductor wafer that includes the base wafer 602, the buffer layer 604, the carrier supply semiconductor 608, the mobility lowering semiconductor 612, the compound semiconductor 614, the mobility lowering semiconductor 616, the carrier supply semiconductor 620, and the barrier formation semiconductor 621 is prepared as shown in FIG. 6.

The preparation of the semiconductor wafer 600 is performed such that, on the base wafer 602, the buffer layer 604, the carrier supply semiconductor 608, the mobility lowering semiconductor 612, the compound semiconductor 614, the mobility lowering semiconductor 616, the carrier supply semiconductor 620, and the barrier formation semiconductor 621 are sequentially formed by the epitaxial growth method and in the same manner as the above-described method of producing a semiconductor wafer. In this way, the semiconductor wafer preparation is completed.

In the step S520 of providing ohmic electrodes, the ohmic electrode 622 and the ohmic electrode 624 are formed on the surface of the barrier formation semiconductor 621 as shown in FIG. 6. The ohmic electrode 622 and the ohmic electrode 624 are used to apply voltages and measure current values. The ohmic electrode 622 and the ohmic electrode 624 are formed using a resist mask in which an opening is formed in a position corresponding to the ohmic electrode 622 and the ohmic electrode 624 are to be formed. The resist mask is formed on the surface of the carrier supply semiconductor 620 by, for example, a photolithography method. The resist is lifted off after metal for electrodes is deposited, and through this process the ohmic electrodes are formed.

A material for the ohmic electrode 622 and the ohmic electrode 624 can be any electrically conductive material including metal such as Au, Ni, Al, W and Ti, metal alloy such as AuGe, and impurity-doped semiconductors. The ohmic electrode 622 and the ohmic electrode 624 can have a structure in which the above-mentioned conductive materials are layered.

In the step S530 of measuring current values corresponding to voltages, a voltage that varies in a certain voltage range is applied between the ohmic electrode 622 and the ohmic electrode 624, and a current value corresponding to each of the applied voltage is measured. An example of the measurement results is represented by square symbols in FIG. 7 which will be described below.

In the step S540 of approximating the measured values by a polynomial, the current values measured corresponding to the varying voltage values are approximated by a polynomial of the electric field intensity that corresponds to each voltage value with least-square technique. Such polynomial can be represented by, for example, the following expression:

$$y=ax^3+bx^2+cx \qquad \text{(Expression 1)}$$

In Expression 1, x is a variable and represents the electric field intensity, and y is a variable and represents the current. Moreover, 'a' is the third-order coefficient, 'b' is the second-order coefficient, and 'c' is the first-order coefficient.

In the step S550 of judging the linearity of the voltage-current characteristic, the absolute value of the ratio of the third-order coefficient 'a' of Expression 1 obtained in S540 to the first-order coefficient 'c', or |a/c| is calculated. Furthermore, whether the linearity of the voltage-current characteristic is conforming or non-conforming is judged by judging if the absolute value |a/c| is less than a prescribed value or not.

The smaller the absolute value of the third-order coefficient, the better linearity of the voltage-current curve can be obtained, resulting in a better voltage-current characteristic of the electronic element. In addition, as the first-order coefficient becomes larger, the rising portion of the current curve becomes larger and the on resistance becomes smaller. Therefore, the smaller the absolute value |a/c| of the ratio of the third-order coefficient 'a' to the first-order coefficient 'c' is, the smaller on resistance is obtained, and therefore it is possible to obtain a compound semiconductor epitaxial wafer that has a fine voltage-current characteristic.

Consequently, the acceptability for the linearity of the voltage-current characteristic can be judged by using the absolute value |a/c| of the ratio of the third-order coefficient 'a' to the first-order coefficient 'c' as a linearity index. The semiconductor wafer of which voltage-current characteristic has been measured can be judged as conforming or acceptable when the linearity index |a/c| is less than $0.037\,[(kV/cm)^{-2}]$, preferably $0.030\,[(kV/cm)^{-2}]$ or less, more preferably $0.028\,[(kV/cm)^{-2}]$ or less.

EXAMPLE

A method of judging the quality of a semiconductor wafer will be now described with reference to examples. In this example, the linearity of the voltage-current characteristic was judged using the semiconductor wafer 400 shown in FIG. 4. A high-resistance semi-insulating GaAs single-crystal wafer was used as the base wafer 402. On the base wafer 402, the buffer layer 404, the buffer layer 406, the carrier supply semiconductor 408, the spacer layer 410, the mobility lowering semiconductor 412, the compound semiconductor 414, the mobility lowering semiconductor 416, and the spacer layer 418, the carrier supply semiconductor 420, and the barrier formation semiconductor 430 were sequentially formed by epitaxial growth using the above-described MOCVD method. In this way, the semiconductor wafer 400 was prepared.

Table 1 shows the composition, the film thickness and the impurity concentration of each layer. Seven different semiconductor wafers 400 were formed such that changing the impurity concentration of the N-type impurity in the mobility lowering semiconductor 412 and the mobility lowering semiconductor 416 as no-doping, $1.0\times10^{17}$, $5.0\times10^{17}$, $1.0\times10^{18}$, $2.6\times10^{18}$, $4.4\times10^{18}$, and $6.0\times10^{18}$ $(cm^{-3})$. Electric current values of each semiconductor wafer 400 were measured when a voltage is applied to each semiconductor wafer, and the linearity of the voltage-current characteristic was judged as conforming or not.

TABLE 1

|  | COMPOSITION | FILM THICKNESS (nm) | IMPURITY CONCENTRATION $(cm^3)$ |
|---|---|---|---|
| BARRIER FORMATION SEMICONDUCTOR 430 | p-$Al_{0.20}Ga_{0.80}As$ | 35 | $5.0 \times 10^{15}$ |
| CARRIER SUPPLY SEMICONDUCTOR 420 | n-$Al_{0.20}Ga_{0.80}As$ | 6 | $4.0 \times 10^{18}$ |
| SPACER LAYER 418 | p-$Al_{0.20}Ga_{0.80}As$ | 3 | $5.0 \times 10^{15}$ |
| MOBILITY LOWERING SEMICONDUCTOR 416 | n-GaAs | 6 | $0\sim4.4 \times 10^{18}$ |
| COMPOUND SEMICONDUCTOR 414 | i-$In_{0.35}Ga_{0.65}As$ | 5 | — |
| MOBILITY LOWERING SEMICONDUCTOR 412 | n-GaAs | 6 | $0\sim4.4 \times 10^{18}$ |
| SPACER LAYER 410 | p-$Al_{0.20}Ga_{0.80}As$ | 3 | $5.0 \times 10^{15}$ |
| CARRIER SUPPLY SEMICONDUCTOR 408 | n-$Al_{0.20}Ga_{0.80}As$ | 4 | $3.0 \times 10^{18}$ |
| BUFFER LAYER 406 | p-$Al_{0.20}Ga_{0.80}As$ | 200 | $1.0 \times 10^{16}$ |
| BUFFER LAYER 404 | p-GaAs | 50 | $1.0 \times 10^{15}$ |
| BASE WAFER 402 | GaAs | — | — |

In the formation of the GaAs layer, trimethyl gallium (TMG) and arsine ($AsH_3$) were used as Group 3 element source and the Group 5 element source gas respectively. In the formation of the AlGaAs layer, trimethyl aluminum (TMA) was further used as the Group 3 element source. In the formation of the InGaAs layer, trimethyl indium (TMI) was further used as the Group 3 element source. High-purity hydrogen is used as the carrier gas for the sources. The pressure inside the reduced-pressure barrel-type MOCVD reactor was set to 0.1 atm, the growth temperature was set to 650° C., and the growth rate was set to 1 to 3 μm/hr, and epitaxial growth was performed. Disilane ($Si_2H_6$) was used as the N-type dopant, and the impurity concentration in the mobility lowering semiconductor 412 and the mobility lowering semiconductor 416 were changed by adjusting the flow rate of disilane at the time of growth.

Next, a resist mask that has an opening in the position corresponding to the ohmic electrodes to be formed was formed on the barrier formation semiconductor 430 by a photolithography method. Subsequently, AuGe, Ni and Au were sequentially deposited on the barrier formation semiconductor 430, and then the resist was lifted off, and as a consequence, two electrodes having a size of 150 μm×200 μm and a space of 6 μm therebetween were provided. The length of the sides of the electrodes that oppose each other with the spacing of 6 μm was 200 μm.

Figure 7:
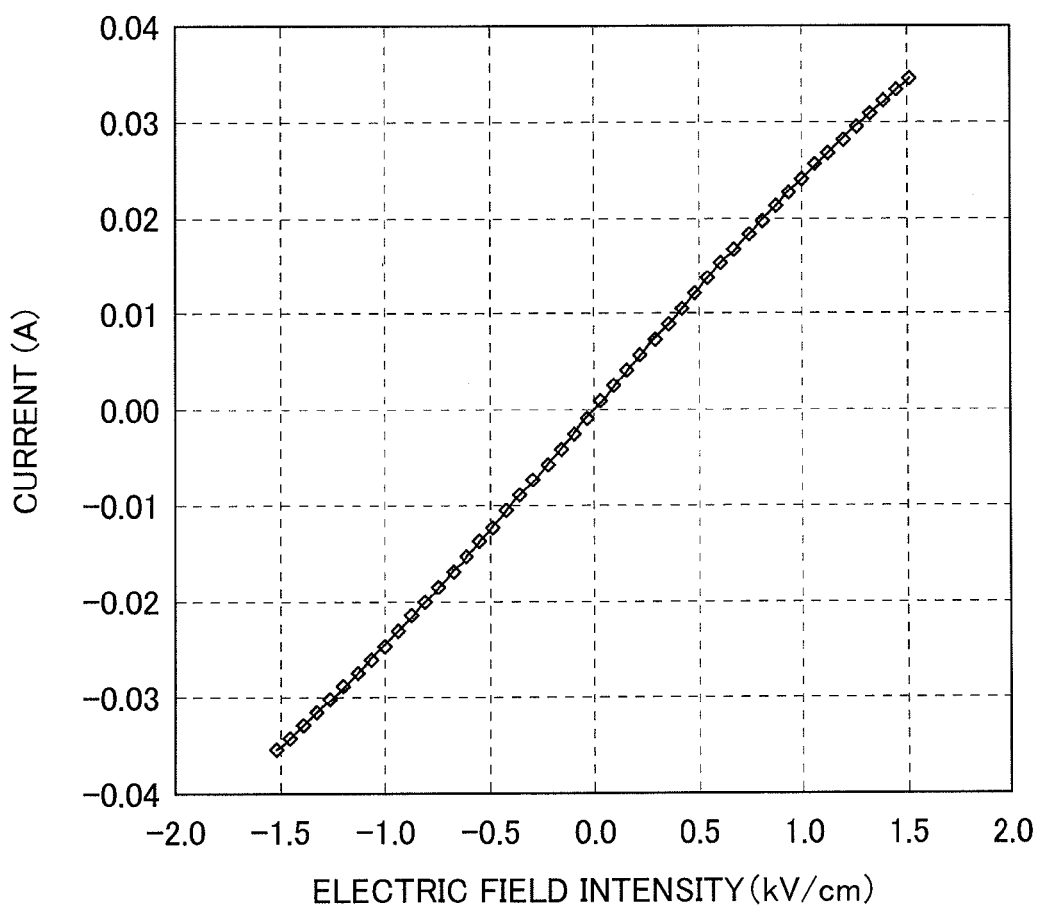
FIG. 7 shows a field intensity-current curve.

Voltage was applied to between the electrodes such that the electric field intensity varies within a range of from −1.5 [kV/cm] to +1.5 [kV/cm], and current values were measured. FIG. 7 shows a field intensity-current curve of the semiconductor wafer 400 in which the impurity concentration in the mobility lowering semiconductor 412 and the mobility lowering semiconductor 416 were $4.4\times10^{18}$ $(cm^{-3})$. The horizontal axis represents the field intensity and the vertical axis represents measured current values. In FIG. 7, the square symbols represent measured values.

The least square approach was applied to the measure results to approximate the results by a third-order polynomial, and the third-order polynomial that represents the relationship between the field intensity and the current for each semiconductor wafer 400 was obtained. More specifically, the third-order polynomial Expression 2 hereunder described was obtained corresponding to the measured results of FIG. 7. The curve shown in FIG. 7 was the curve corresponding to Expression 2. FIG. 7 illustrates that Expression 2 is well-fitted to the measured results.

$$y = -0.000963x^3 - 0.000226x^2 + 0.253x \quad \text{(Expression 2)}$$

Table 2 shows the third-order coefficient 'a' and the first-order coefficient 'c' of the third-order approximating polynomial, and the linearity index |a/c| for the seven semiconductor wafers 400 in which the impurity concentration in the mobility lowering semiconductor 412 and the mobility lowering semiconductor 416 was varied.

TABLE 2

| IMPURITY CONCENTRATION IN MOBILITY LOWERING SEMICONDUCTOR ($cm^{-3}$) | a | c | |a/c| |
|---|---|---|---|
| 0 | −0.001270 | 0.0341 | 0.037 |
| $1.0 \times 10^{17}$ | −0.000851 | 0.0320 | 0.027 |
| $5.0 \times 10^{17}$ | −0.000956 | 0.0320 | 0.030 |
| $1.0 \times 10^{18}$ | −0.000940 | 0.0300 | 0.031 |
| $2.6 \times 10^{18}$ | −0.000961 | 0.0268 | 0.036 |
| $4.4 \times 10^{18}$ | −0.000963 | 0.0253 | 0.038 |
| $6.0 \times 10^{18}$ | −0.000981 | 0.0242 | 0.041 |

Figure 8:
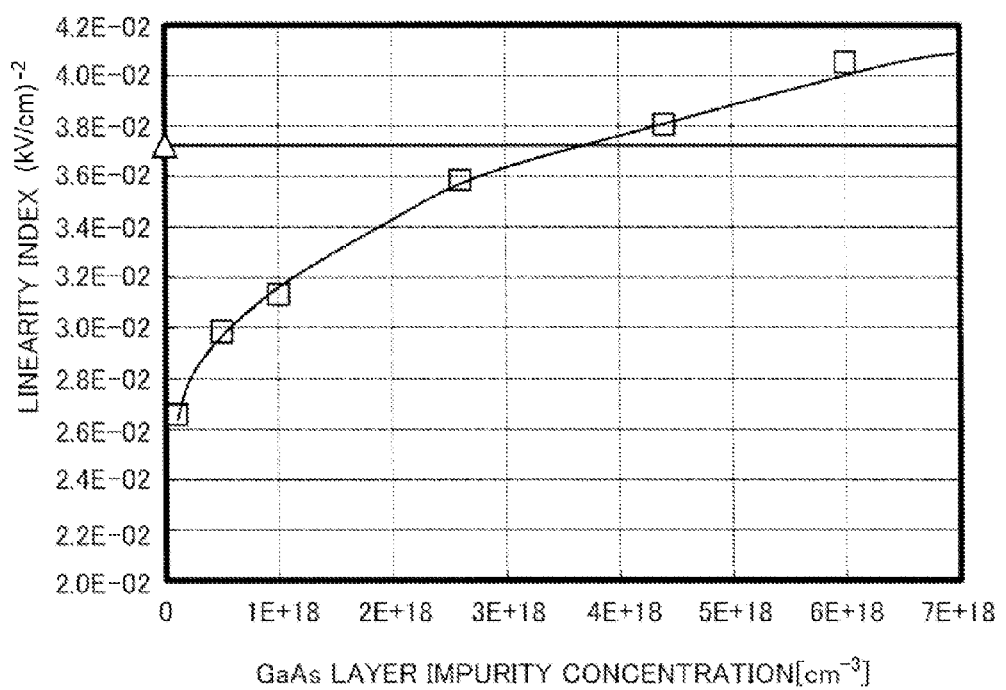
FIG. 8 illustrates an effect of the impurity concentration in a mobility-reduced semiconductor affecting a linearity index.

FIG. 8 is a chart showing the results in Table 2 with the horizontal axis representing the impurity concentration in the mobility lowering semiconductor 412 and the mobility lowering semiconductor 416, and the vertical axis representing the linearity index |a/c|. FIG. 8 shows the effect of the impurity concentration in the mobility lowering semiconductor affecting the linearity index. In FIG. 8, the triangle symbol denotes a linearity index of the field intensity-current curve for the semiconductor wafer 400 to which no doping was performed. When no doping was performed, the linearity index was 0.037 [$(kV/cm)^{-2}$]. In other words, the linearity index for the semiconductor wafer 400 that does not have the mobility lowering semiconductor 416 is likely to be 0.037 [$(kV/cm)^{-2}$].

In FIG. 8, the square symbol denotes a linearity index of the field intensity-current curve for the semiconductor wafer 400 in which a donor impurity was doped in the mobility lowering semiconductor 412 and the mobility lowering semiconductor 416. Better linearity was shown in the impurity concentration range of more than 0 and less than $3.8 \times 10^{18}$ ($cm^{-3}$) compared to the linearity of the voltage-current characteristic of the semiconductor wafer 400 in which doping was not performed. Considering measurement errors, a fine characteristic having a linearity index |a/c| of bellow 0.037 [$(kV/cm)^{-2}$], which is the linearity index of the conventional semiconductor wafer 400 that does not have the mobility lowering semiconductor 416, was obtained in the impurity concentration range of from $2 \times 10^{16}$ ($cm^{-3}$) to $3.6 \times 10^{18}$ ($cm^{-3}$).

From the above results, it was demonstrated that whether the semiconductor wafer 400 including the mobility lowering semiconductor 412 and mobility lowering semiconductor 416 has a voltage-current characteristic with a fine linearity or not can be judged by determining if the linearity index |a/c| obtained by the measurement of current and voltage of the stack including the compound semiconductor 414, the carrier supply semiconductor 420, the mobility lowering semiconductor 412 and mobility lowering semiconductor 416 is less than 0.037 [$(kV/cm)^{-2}$] or not. In order to improve the linearity of the voltage-current characteristic of the semiconductor wafer 400, it is preferable that the semiconductor wafer 400 be judged as conforming when the linearity index |a/c| is less than 0.030 [$(kV/cm)^{-2}$], and it is more preferable that the semiconductor wafer 400 be judged as conforming when the linearity index |a/c| is less than 0.028 [$(kV/cm)^{-2}$] and set this value as criterion.

When the impurity concentration in the mobility lowering semiconductor 412 and the mobility lowering semiconductor 416 was $4.4 \times 10^{18}$ ($cm^{-3}$), the linearity index was 0.038 [$(kV/cm)^{-2}$], and the linearity was deteriorated compared to the semiconductor wafer 400 that does not have the mobility lowering semiconductor 416. This happened presumably due to the decreased first-order coefficient 'c' and the increased resistance in the mobility lowering semiconductor 416 as shown in Table 2. More specifically, when the impurity concentration in the mobility lowering semiconductor 416 is too high, the mobility of a carrier in the ground state is also lowered by an effect of the impurity scattering, and the effect of decreasing the third-order coefficient 'a' is balanced off.

Considering this fact, it is desired that the mobility lowering semiconductor 416 be a N-type GaAs layer that contains a donor impurity of $3.6 \times 10^{18}$ [$cm^{-3}$] or less, preferably $3.0 \times 10^{18}$ [$cm^{-3}$] or less, more preferably $1.0 \times 10^{18}$ [$cm^{-3}$] or less, and most preferably $0.5 \times 10^{18}$ [$cm^{-3}$], in order to produce the semiconductor wafer 400 that has a fine linearity index.

With the above described method of judging the quality of a semiconductor wafer, it is possible to judge whether the semiconductor wafer formed by epitaxial growth is adequate for a transistor fabrication or not as the transistor has not been formed in the semiconductor wafer yet.

Figure 9:
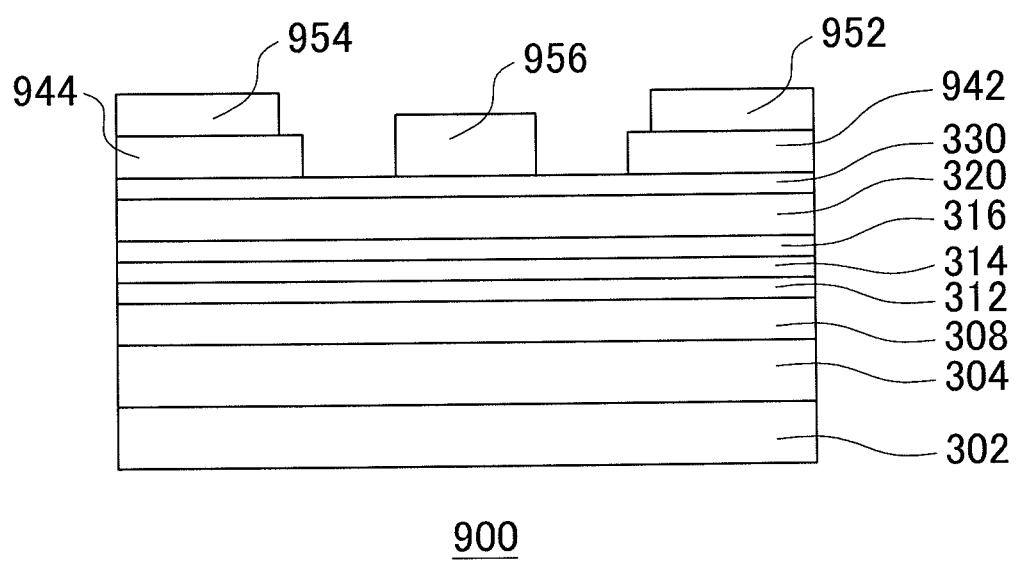
FIG. 9 illustrates an example of a sectional view of an electronic device 900.

FIG. 9 illustrates an example of a sectional view of an electronic device 900. An electronic device 900 includes the base wafer 302, the buffer layer 304, the carrier supply semiconductor 308, the mobility lowering semiconductor 312, the compound semiconductor 314, the mobility lowering semiconductor 316, the carrier supply semiconductor 320, the barrier formation semiconductor 330, a drain mesa 942, an ohmic electrode 952, a source mesa 944, an ohmic electrode 954 and a control electrode 956. The electronic device 900 is an example of a high-electron-mobility transistor that is produced using the semiconductor 300. Descriptions for the common structures as those of the semiconductor wafer 300 will be hereunder omitted. The terms "drain mesa" and "source mesa" refer to a convex-shaped semiconductor region in which a drain or a source is formed.

The ohmic electrode 952 and the ohmic electrode 954 function as a drain electrode and a source electrode of a high-electron-mobility transistor respectively. A material for the ohmic electrode 952 and the ohmic electrode 954 can be any electrically conductive material including metal such as Au, Ni, Al, W and Ti, metal alloy such as AuGe, and impurity-doped semiconductors. The ohmic electrode 952 and the ohmic electrode 954 can have the layered structure of the above mentioned conductive materials.

The drain mesa 942 secures an electric conductivity between the ohmic electrode 952 and the barrier formation semiconductor 330 and the semiconductors situated below the barrier formation semiconductor 330. The source mesa 944 secures an electric conductivity between the ohmic electrode 954 and the barrier formation semiconductor 330 and the semiconductors situated below the barrier formation semiconductor 330. The drain mesa 942 and the source mesa 944 are made of, for example, GaAs or InGaAs.

The control electrode 956 controls the drain current flowing between the ohmic electrode 952 and the ohmic electrode 954 with a voltage applied thereto. A material for forming the control electrode 956 is, for example, Ni, Au, Pt, Ti and W. The material for the control electrode 956 can be metal of the above-mentioned element alone, or alloy of these metal. The control electrode 956 can have a layered structure of the metals of the above-mentioned element alone or the alloys of the metals.

Figure 10:
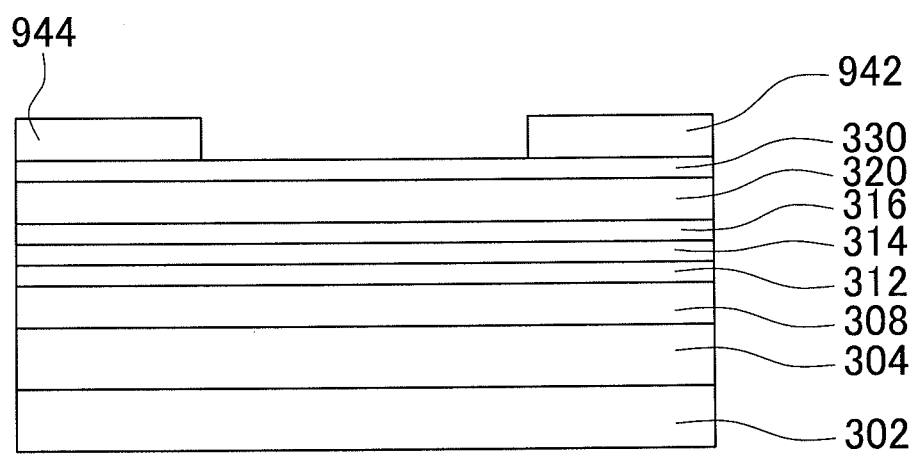
FIG. 10 shows an exemplary sectional view of the electronic device 900 during a manufacturing step.
Figure 11:
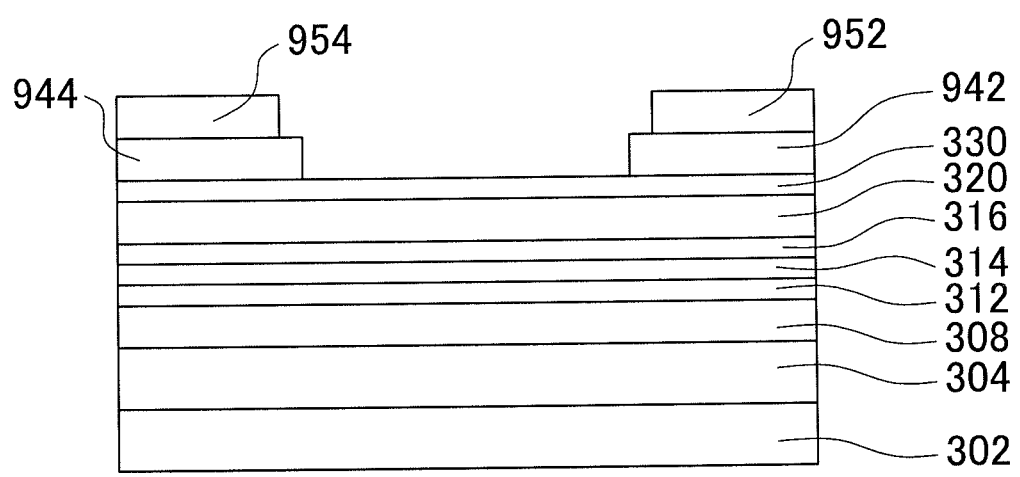
FIG. 11 shows an exemplary sectional view of the electronic device 900 during a manufacturing step.

FIG. 10 and FIG. 11 schematically illustrate an exemplary sectional view of the electronic device 900 during production process. The production process of the electronic device 900 will be now described with reference to FIG. 10 and FIG. 11.

Firstly, the semiconductor wafer 300 is prepared according to the method of producing a semiconductor wafer described above. Referring to FIG. 10, the drain mesa 942 and the source mesa 944 are formed by, for example, etching the contact layer 340 by a photolithography method. For example, a resist is applied to the surface of the contact layer 340, and then the resist is removed other than the area where the drain mesa 942 and the source mesa 944 are to be formed. Subsequently, the contact layer 340 that is left in the area other than the area where the drain mesa 942 and the source mesa 944 are to be formed is removed by etching, and then the drain mesa 942 and the source mesa 944 are formed.

Referring to FIG. 11, a resist mask that has openings at positions where the ohmic electrode 952 and the ohmic electrode 954 are to be formed is then formed by a photolithography method. Subsequently, materials for forming the ohmic electrode 952 and the ohmic electrode 954, for example, AuGe, Ni and Au, are sequentially deposited, and then the resist is lifted off to form the ohmic electrode 952 and the ohmic electrode 954.

As shown in FIG. 9, a resist mask that has an opening at a position where the control electrode 956 is to be formed is formed by a photolithography method, a material for forming the control electrode 956 is deposited, and the resist is then lifted off to form the control electrode 956. Through the above-described process, the electronic device 900 is completed.

The invention claimed is:

1. A semiconductor wafer comprising:
   a compound semiconductor that produces a two-dimensional carrier gas;
   a first carrier supply semiconductor that supplies carriers to the compound semiconductor;
   a first mobility lowering semiconductor disposed between the compound semiconductor and the first carrier supply semiconductor;
   a second mobility lowering semiconductor disposed on a side of the compound semiconductor opposite the first carrier supply semiconductor; and
   a second carrier supply semiconductor disposed on a side of the second mobility lowering semiconductor opposite the compound semiconductor;
   wherein the first mobility lowering semiconductor has a mobility lowering factor that makes the mobility of the carriers in the first mobility lowering semiconductor lower than the mobility of the carriers in the compound semiconductor, and the second mobility lowering semiconductor has a mobility lowering factor that makes the mobility of the carriers in the second mobility lowering semiconductor lower than the mobility of the carriers in the compound semiconductor,
   the mobility lowering factor of the first mobility lowering semiconductor is an impurity, a crystal defect, a low-mobility material, or a band-barrier material, and the mobility lowering factor of the second mobility lowering semiconductor is an impurity, a crystal defect, a low-mobility material, or a band-barrier material, and the first and second carrier supply semiconductors are N-type AlGaAs, the first and second the mobility lowering semiconductors are N-type GaAs that contains $3.6 \times 10^{18}$ [cm$^{-3}$] or less of a donor impurity, and the compound semiconductor is InGaAs.

2. The semiconductor wafer according to claim 1, wherein, the probability distribution of the carriers in the first and second mobility lowering semiconductors among different states is such that the probability of a given carrier in an excited state is higher than the probability of the carrier in the ground state.

3. The semiconductor wafer according to claim 2, wherein the excited state is a state where a given carrier is in the first excited level.

4. The semiconductor wafer according to claim 1, wherein when a current y that flows in the compound semiconductor under the application of a voltage to between two different points on the compound semiconductor is approximated by an approximating polynomial $y=ax^3+bx^2+cx$, where x, which is a variable, represents an electric field intensity that corresponds to the voltage and varies within a range of from −1.5 [kV/cm] to +1.5 [kV/cm], the absolute value of the ratio of the third-order coefficient 'a' of the approximating polynomial to the first-order coefficient 'c' of the approximating polynomial, or |a/c|, is less than 0.037 [(kV/cm)$^{-2}$].

5. The semiconductor wafer according to claim 1, wherein the carriers are electrons, and the impurity is a donor impurity.

6. The semiconductor wafer according to claim 1, wherein the donor impurity is at least one atom selected from the group consisting of Si, Se, Ge, Sn, Te and S.

7. A method of producing a semiconductor wafer, comprising:
   forming a first carrier supply semiconductor;
   forming a first mobility lowering semiconductor on the first carrier supply semiconductor;
   forming a compound semiconductor on the first mobility lowering semiconductor, the first carrier supply semiconductor layer operable to supply carriers to the compound semiconductor and the compound semiconductor operable to produce a two-dimensional carrier gas;
   forming a second mobility lowering semiconductor on the compound semiconductor; and
   forming, on the second mobility lowering semiconductor, a second carrier supply semiconductor that supplies carriers to the compound semiconductor,
   wherein the first mobility lowering semiconductor has a mobility lowering factor that makes the mobility of the carriers in the first mobility lowering semiconductor lower than the mobility of the carriers in the compound semiconductor, and the second mobility lowering semiconductor has a mobility lowering factor that makes the mobility of the carriers in the second mobility lowering semiconductor lower than the mobility of the carriers in the compound semiconductor,
   the mobility lowering factor of the first mobility lowering semiconductor is an impurity, a crystal defect, a low-mobility material, or a band-barrier material, and the mobility lowering factor of the second mobility lowering semiconductor is an impurity, a crystal defect, a low-mobility material, or a band-barrier material, and the first and second carrier supply semiconductors are N-type AlGaAs, the first and second mobility lowering semiconductors are N-type GaAs that contains $3.6 \times 10^{18}$ [cm$^{-3}$] or less of a donor impurity, and the compound semiconductor is InGaAs.

8. An electronic device, comprising
a compound semiconductor that produces a two-dimensional carrier gas and has a channel through which the two-dimensional carrier gas flows;
a first carrier supply semiconductor that supplies carriers to the compound semiconductor;
a first mobility lowering semiconductor disposed between the compound semiconductor and the first carrier supply semiconductor;
a second mobility lowering semiconductor disposed on a side of the compound semiconductor opposite the first carrier supply semiconductor;
a second carrier supply semiconductor disposed on a side of the second mobility lowering semiconductor opposite the compound semiconductor;
a pair of ohmic electrodes that connect to each other by the channel; and
a control electrode that controls impedance between the pair of the ohmic electrodes,
wherein the first mobility lowering semiconductor has a mobility lowering factor that makes the mobility of the carriers in the first mobility lowering semiconductor lower than the mobility of the carriers in the compound semiconductor, and the second mobility lowering semiconductor has a mobility lowering factor that makes the mobility of the carriers in the second mobility lowering semiconductor lower than the mobility of the carriers in the compound semiconductor, the mobility lowering factor of the first mobility lowering semiconductor is an impurity, a crystal defect, a low-mobility material, or a band-barrier material, and the mobility lowering factor of the second mobility lowering semiconductor is an impurity, a crystal defect, a low-mobility material, or a band-barrier material, and the first and second carrier supply semiconductors are N-type AlGaAs, the first and second mobility lowering semiconductors are N-type GaAs that contains $3.6 \times 10^{18}$ [$cm^{-3}$] or less of a donor impurity, and the compound semiconductor is InGaAs.

* * * * *